US006473188B1

(12) United States Patent
Kim

(10) Patent No.: US 6,473,188 B1
(45) Date of Patent: Oct. 29, 2002

(54) APPARATUS AND METHOD FOR ALIGNING COMPONENTS

(75) Inventor: Sang-cheol Kim, Sungnam (KR)

(73) Assignee: Samsung Aerospace Industries, Ltd., Kyongsangnam-do (KR)

( * ) Notice: Subject to any disclaimer, the term of this patent is extended or adjusted under 35 U.S.C. 154(b) by 0 days.

(21) Appl. No.: 09/400,278

(22) Filed: Sep. 21, 1999

(30) Foreign Application Priority Data

Sep. 24, 1998 (KR) .............................................. 98-39728

(51) Int. Cl.[7] ........................... G01B 11/14; G01B 11/00
(52) U.S. Cl. ........................................ 356/621; 356/400
(58) Field of Search ................................ 356/621, 400, 356/609, 237.6, 399

(56) References Cited

U.S. PATENT DOCUMENTS

| 4,628,464 A | * | 12/1986 | McConnell | ................. | 364/513 |
|---|---|---|---|---|---|
| 4,827,436 A | | 5/1989 | Sabersky et al. | | |
| 5,278,634 A | * | 1/1994 | Skunes et al. | ............... | 356/400 |
| 5,331,406 A | * | 7/1994 | Fishbaine et al. | ........... | 356/375 |
| 5,570,181 A | * | 10/1996 | Yasuo | ......................... | 356/336 |
| 5,686,994 A | * | 11/1997 | Tokura | ........................ | 356/394 |

FOREIGN PATENT DOCUMENTS

KR     97-705004     9/1997

* cited by examiner

Primary Examiner—Richard A. Rosenberger
Assistant Examiner—Layla Lauchman
(74) Attorney, Agent, or Firm—Finnegan, Henderson, Farabow, Garrett & Dunner LLP

(57) ABSTRACT

An apparatus for aligning components is disclosed. The apparatus includes a light source, a scattering plate for scattering light emitted from the light source towards the side of the component, a focus lens for focusing the scattered light having passed through the component, and a light detector for receiving the focused light from the focus lens to detect a side image of the component.

9 Claims, 5 Drawing Sheets

APPARATUS AND METHOD FOR ALIGNING COMPONENTS

BACKGROUND OF THE INVENTION

1. Field of the Invention

The present invention relates to an apparatus for precisely aligning electronic components on a printed circuit board (PCB) and a method for aligning electronic components using the same.

2. Description of the Related Art

A component mounting apparatus such as a chip mounter mounts a small-sized electronic component on a printed circuit board (PCB). The component mounting apparatus includes a suction unit for sucking and grabbing electronic components, a head unit for supporting, rotating and moving up and down the suction unit, and a transfer unit for moving the head unit in X-Y-direction.

In the operation of the component mounting apparatus, electronic components are picked up by the suction unit, and then the picked-up components are moved to a mounting position by the transfer unit. Subsequently, the electronic components are mounted on the PCB by rotating and moving up and down the suction unit.

In the process of mounting the electronic components, the electronic components must be precisely aligned in the mounting unit of the PCB. The alignment of components is performed using a vision system or optical diffraction.

In the vision system, images of electronic components are captured by a camera and the captured image is transferred to a computer. Also, the center point of the electronic component displayed on a monitor is compared to that of a predetermined template pattern, and then errors of X and Y coordinates and a rotation angle are detected to thereby correct the error, and then the components are mounted on the PCB. However, by the above-described method, components must be picked up by the suction unit to be moved to a region where the vision system is positioned.

Thus, a method for emitting light to electronic components picked up by an suction unit of a pickup device to directly detect an error of the electronic components is disclosed in U.S. Pat. No. 5,559,727. That is, a shadow of the component generated by emitting light to the side of the component is detected by a charge-coupled device (CCD). At this time, the width of the shadow of the component is changed according to rotation of electronic components, so that the change of the shadow width is detected to thereby detect a position and an angle of the component.

In the above-described method, light emitted to the side of the component must be parallel light to precisely detect the change of the shadow width of the component. Thus, the method requires a device to form parallel light, which makes the structure of the device complicated.

SUMMARY OF THE INVENTION

To solve the above problems, it is an object of the present invention to provide an apparatus for aligning components in which electronic components are picked up by a pickup device, and then the position and angle of the component are measured to precisely install the component, and a method for aligning components using the same.

Accordingly, to achieve the above object, the apparatus for aligning components includes a light source; a scattering plate for scattering light emitted from the light source towards the side of the component; a focus lens for focusing the scattered light having passed through the component; and a light detector for receiving the focused light from the focus lens to detect a side image of the component.

Here, the light source and the scattering plate are installed at one side of the component, and the focus lens and the light detector are installed in the other side of the component.

According to another embodiment of the present invention, the light source includes first and second light sources installed at one side of the component, the scattering plate includes a first scattering plate installed between the component and the first light source and a second scattering plate installed between the component and the second light source, and the focus lens and the light detector are aligned to be perpendicular to the first and the second light sources with respect to the component.

According to still another embodiment of the present invention, the light source, the scatter plate, the image formation lens and the light detector are aligned at one side of the component.

According to another aspect of the present invention, a method for aligning components includes the steps of: picking up electronic components; scattering light emitted from a light source by a scattering plate to proceed to the side of the component; and detecting a side image of the component which results from the scattered light and is focused by a lens.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
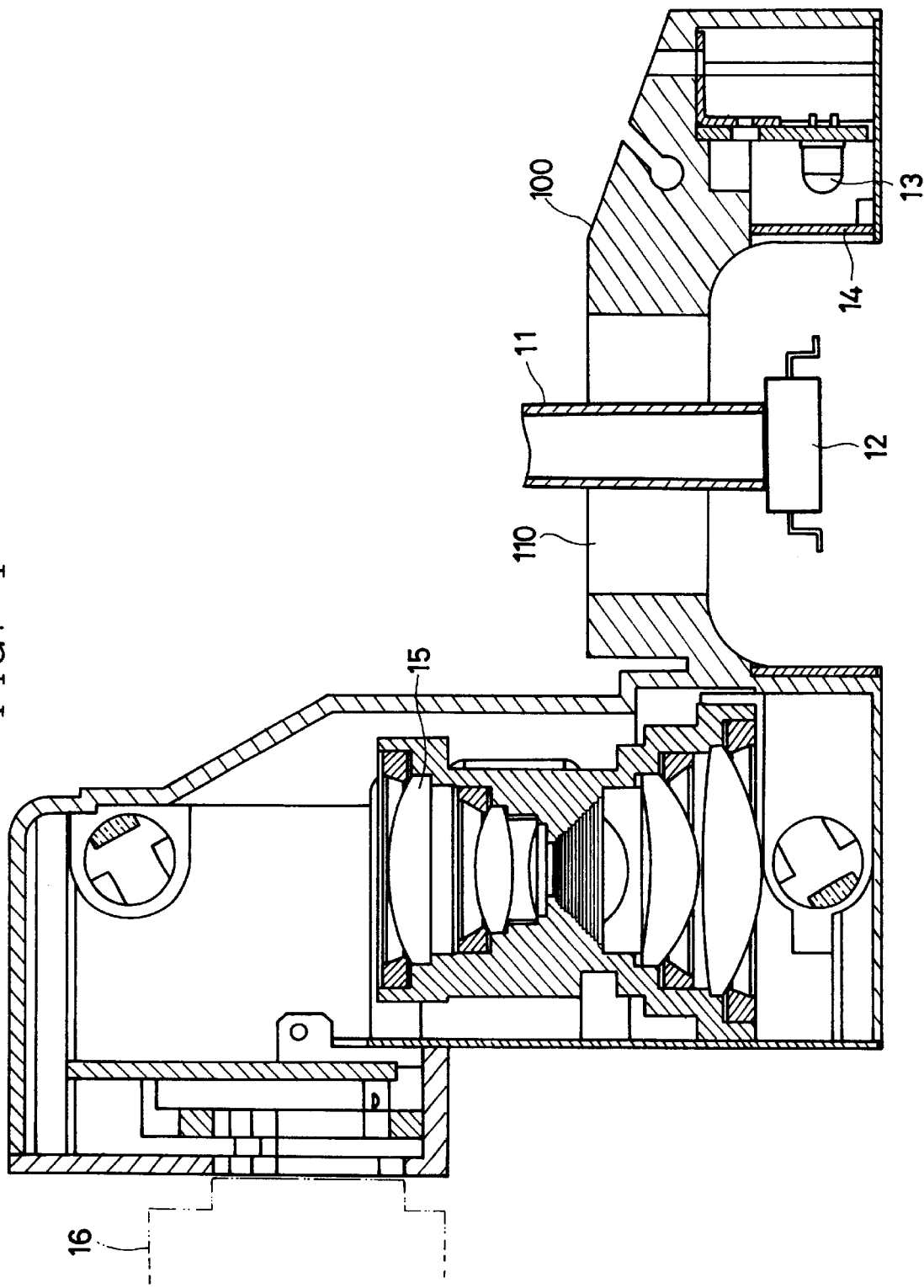
FIG. 1 is a sectional view of the structure of an apparatus for aligning components according to the first embodiment of the present invention.
Figure 2:
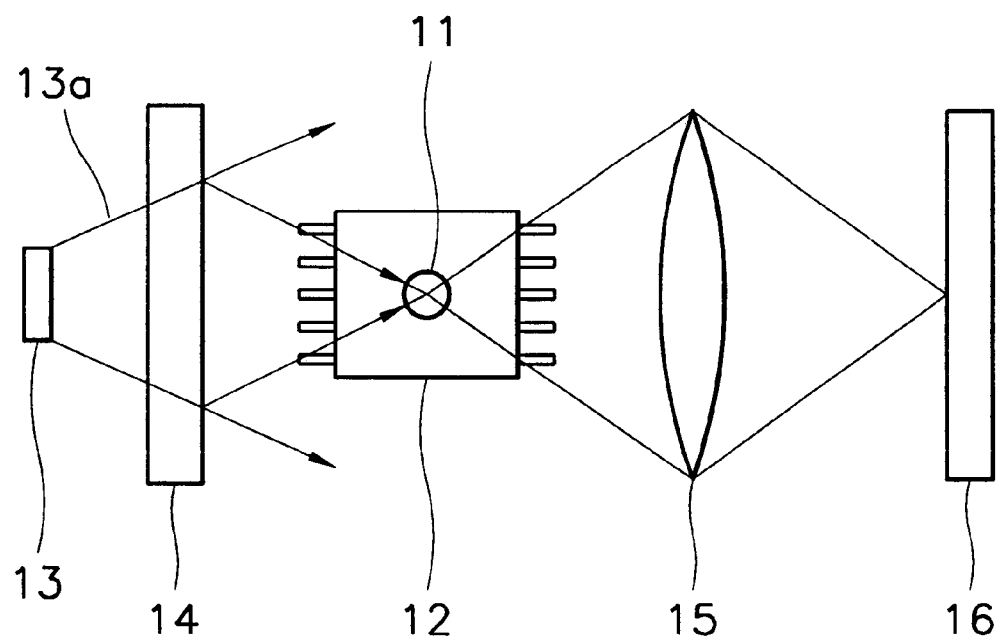
FIG. 2 is a plan view of the apparatus for aligning components of FIG. 1.

Referring to FIGS. 1 and 2 showing the first embodiment of the present invention, the apparatus for aligning components is installed in a frame 100. A suction unit 11 is connected to a head unit (not shown), and is capable of moving up and down and rotating to pick up electronic components 12 in vacuum. A hole 110 is formed in the frame 100, and the hole 110 provides a path through which the components 12 picked up by the suction unit 11 can move to be positioned in the component alignment apparatus so as to check the position thereof before moving to the printed circuit board (PCB).

A light source 13 emitting light 13a to the electronic component 12 sucked up to the end of the suction unit 11 is installed at one side of the frame 100. A laser diode or a light-emitting diode is employed as the light source 13, or the light source 13 can be composed by coupling the laser diode or the light-emitting diode with an optical fiber.

A scattering plate 14 for scattering light 13a emitted from the light source 13 towards the component 12 is installed between the component 12 and the light source 13. Preferably, the scattering plate 14 is a transmission type scatter plate by which light 13a can be transmitted.

A focusing lens 15 is installed at the opposite side of the scattering plate 14 with respect to the component 12, and a light detector 16 for detecting light received from the lens 15, preferably a charge-coupled device (CCD) is connected to the other side of the frame 100. An optical signal detected by the light detector 16 is transferred to a controller (not shown).

In the operation of the apparatus for aligning components according to the present invention, when the electronic components 12 grabbed by the suction unit 11 are positioned in the component alignment apparatus through the hole 110 of the frame 100, the light 13a is emitted from the light source 13 to the scattering plate 14. The scattering plate 14 is formed of a transparent polymeric material, so that the light 13a is transmitted and scattered toward the component 12.

The light 13a incident upon the component 12 is focused by the lens 15 via the component 12, and then the focused light is detected by the light detector 16. A detected optical signal is transferred from the light detector 16 to the controller and the signal is processed.

Here, information on a rotation angle of the component 12 is obtained by obtaining a value of the rotation angle θ of the component 12 from an encoder installed in a motor (not shown) driving the suction unit 11 during rotation of the suction unit 11 grabbing the component 12, and synchronizing the value θ with an image signal of the light detector 16.

Also, information on the positions of the X-axis and Y-axis of the component 12 is obtained by the difference between a reference coordinate value of the center of the suction unit 11 and the center coordinate value of the component 12. That is, an image of the suction unit 11 is detected by the light detector 16 before pickup of the component 12 to obtain the center coordinate of the suction unit 11. Then, the center coordinate of the displaced component 12 in suction is obtained. Information on the positions of the component 12 can be obtained by comparing the coordinate values.

A signal detected from the light detector 16 has the same pattern as the distribution of intensity of the light 13a scattered by the scattering plate 14.

Figure 7:
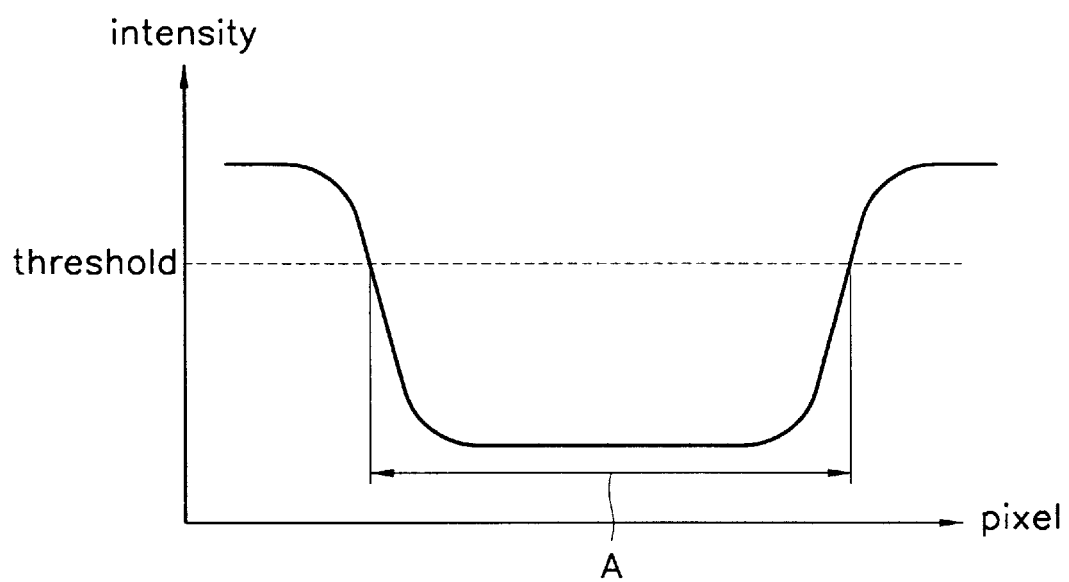
FIG. 7 is a graph of a width of an image of the electronic component detected from the apparatus for aligning components of the present invention.

The information of the component 12 detected by the light detector 16 can be analyzed by the graph of FIG. 7. Here, the horizontal axis of the graph indicates the number of pixels of the light detector 16, and the vertical axis thereof indicates the intensity of the scattered light.

Referring to the graph of FIG. 7, when light is emitted to the side of the component 12, the intensity of light is deteriorated due to the scatter. That is, region A having an intensity lower than a predetermined threshold corresponds to the width of an image of the component 12 formed by the light scattered to the side of the component 12.

Figure 8:
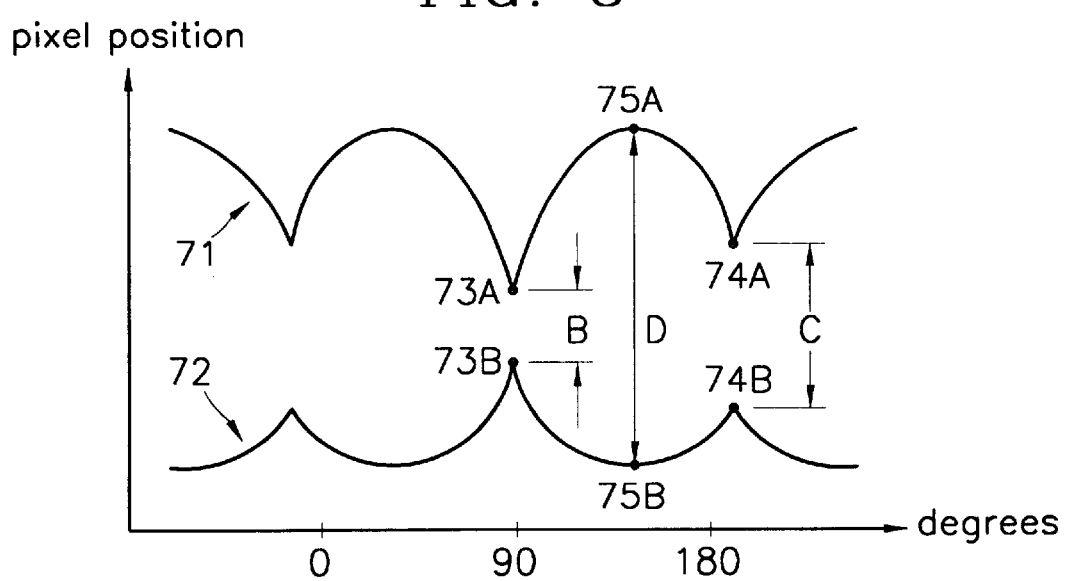
FIG. 8 is a graph of a width of an image according to a change in angles with respect to an electronic component detected from the apparatus for aligning components of the present invention.

When the component 12 is rotated a predetermined angle, the size of the image of the component 12 is changed, which is shown in FIG. 8.

Here, the horizontal axis indicates an angle of rotating the component 12, and the vertical axis indicates the position of the pixel. As shown in the graph, the width of a waveform of a signal detected by the light detector 16 is changed during rotation of the component 12.

Referring to the graph of FIG. 8, a waveform 71 shows the change in the width of a side image of the component 12 changed along one side of the component 12, and a waveform 72 shows the change in the width of a side image of the component 12 changed along the other side of the component 12.

That is, when the component 12 is rectangular, interval B between point 73A and point 73B represents the length of a short side of the component 12, and interval C between point 74A and point 74B represents the length of a long side of the component 12. Also, interval D between point 75A and point 75B represents the length of a diagonal line of the component 12.

As described above, the interval between two curved lines is measured as the size of the side image of the component 12 detected by the light detector 16 from the waveforms 71 and 72. Thus, the coordinate and the rotation angle of the center point when the widths of the component 12 are B and C are obtained, so that coordinates of X-axis and Y-axis and the rotation angle θ of the component 12 are obtained to thereby detect an error comparing with the reference point.

The light source, the scatter plate and the light detector may have various alignments as shown in FIGS. 3 through 6. The same reference characters as those of FIGS. 1 and 2 indicate the same members.

Figure 3:
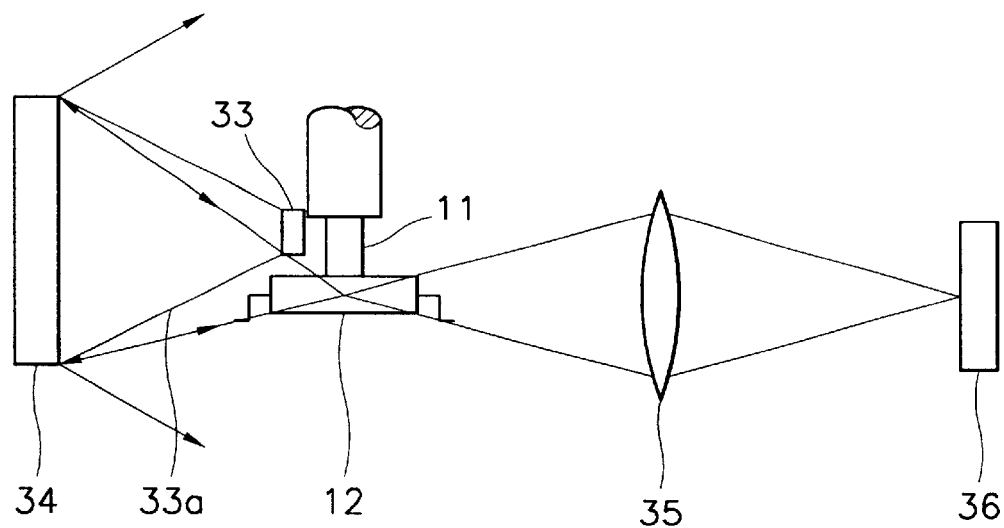
FIG. 3 is a front view of the apparatus for aligning components according to the second embodiment of the present invention.
Figure 4:
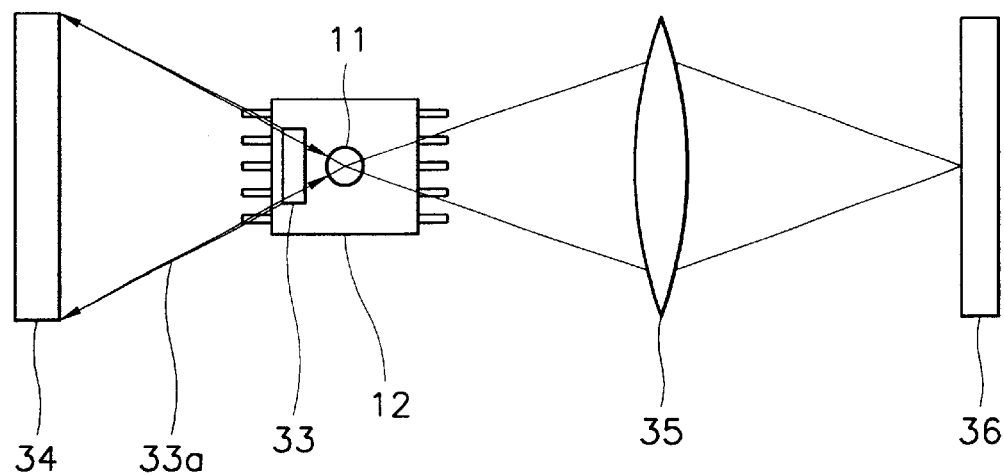
FIG. 4 is a plan view of the apparatus for aligning components of FIG. 3.

In detail, referring to FIGS. 3 and 4 showing a second embodiment, a light source 33 is installed at the top of a component 12, and a scattering plate 34 is installed at one side of a suction unit 11. Preferably, the scatter plate 34 is a reflective type to reflect and scatter light 33a emitted from the light source 33 and inputting the light to the component 12.

The lens 35 focusing light 33a and a light detector 36 detecting the light 33a are installed opposite to the scattering plate 34 with respect to the component 12.

Figure 5:
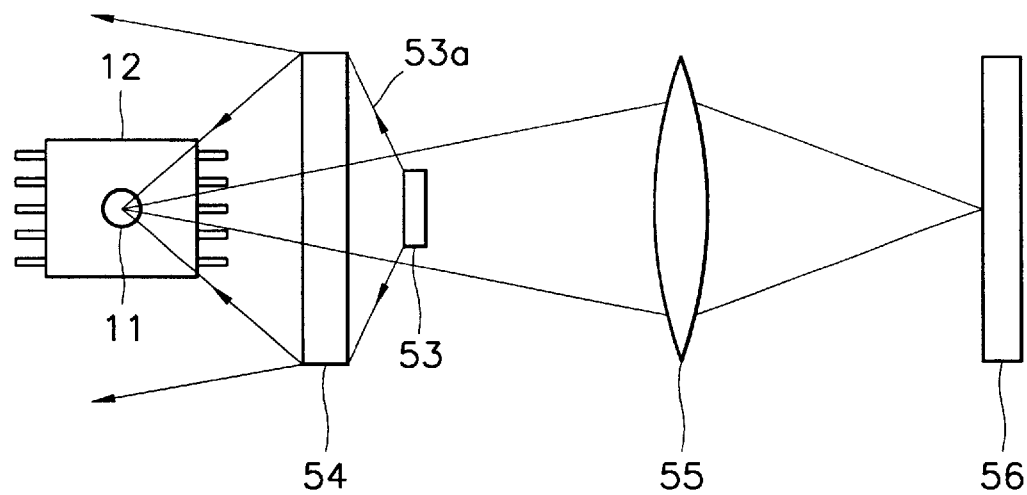
FIG. 5 is a plan view of an apparatus for aligning components according to the third embodiment of the present invention.

Referring to FIG. 5 showing a third embodiment of the present invention, a light source 53, a lens 55 and a light detector 56 are installed at one side of the component 12 grabbed by the suction unit 11. A scattering plate 54 of a transmission type capable of transmitting light 53a is installed between the component 12 and the light source 53.

The light 53a emitted from the light source 53 is transmitted through the scatter plate 54 and the transmitted light is incident to the component 12. The light 53a is reflected from the component 12, focused by the lens 55, and detected by the light detector 56.

Figure 6:
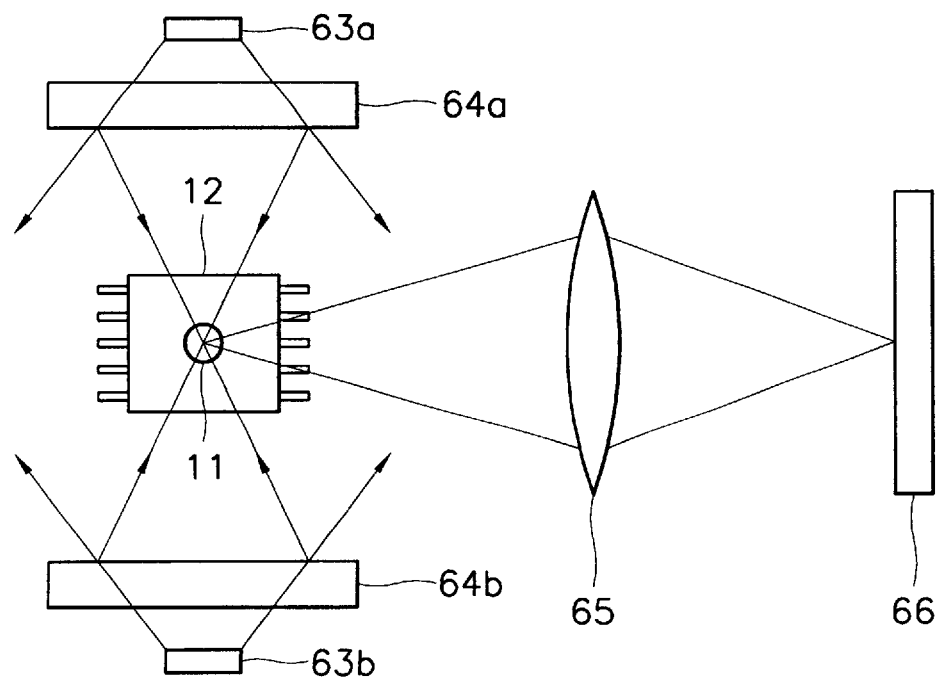
FIG. 6 is a plan view of an apparatus for aligning components according to the fourth embodiment of the present invention.

Referring to FIG. 6 showing a fourth embodiment of the present invention, a first light source 63a, a second light source 63b, and a first scattering plate 64a of transmission-type and a second scatter plate 64b of a transmission type are installed at both sides of the component 12 to face each other. Also, a focus lens 65 and a light detector 66 are installed to be perpendicular to the first and the second light sources 63a and 63b around the component 12.

The operation of the apparatus for aligning components according to the second through fourth embodiments is the same as that of the first embodiment.

According to the apparatus and method for aligning components of the present invention, emitted light is scattered to detect a profile image of the component, and thus coordinates of the position and an angle of the component can be obtained. Thus, precise information for aligning components can be obtained.

What is claimed is:

1. An apparatus for aligning a component comprising:
    a frame having a hole;
    a suction unit combined with the frame, the suction unit being vertically and rotationally movable through the hole to pick up a component;
    a light source mounted on the frame;
    a scattering plate mounted between the light source and the component for scattering light emitted from the light source towards a side of the component;
    a focus lens focusing scattered light passed through the component; and
    a light detector for receiving the focused light from the focus lens to detect a side image of the component.

2. The apparatus of claim 1, wherein the light source and the scattering plate are installed at one side of the component, and the focus lens and the light detector are installed in the other side of the component.

3. The apparatus of claim 2, wherein the scattering plate transmits the light emitted from the light source to the side of the component.

4. The apparatus of claim 1, wherein the scatter plate, the light source, the focus lens and the light detector are aligned in one side of the component.

5. The apparatus of claim 1, wherein the light source includes first and second light sources installed at one side of the component, the scattering plate includes a first scattering plate installed between the component and the first light source and a second scattering plate installed between the component and the second light source, and the focus lens and the light detector are aligned to be perpendicular to the first and the second light sources with respect to the component.

6. The apparatus of claim 5, wherein the scatter plate transmits light emitted from the light source to the side of the component.

7. The apparatus of claim 1, wherein the light source is installed at the top of the component, the scattering plate is installed at one side of the component, and the focus lens and the light detector are installed at the other side of the component.

8. The apparatus of claim 7, wherein the scatter plate reflects the light emitted from the light source to the side of the component.

9. A method for aligning components comprising the steps of:
    picking up electronic components;
    scattering light emitted from a light source by a scattering plate to illuminate to the side of the component; and
    detecting a side image of the component which results from the scattered light and is focused by a lens, during rotation of the component by an arbitrary angle.

* * * * *